(12) United States Patent
Jung et al.

(10) Patent No.: US 7,838,201 B2
(45) Date of Patent: *Nov. 23, 2010

(54) METHOD FOR MANUFACTURING A SEMICONDUCTOR DEVICE

(75) Inventors: Jae Chang Jung, Seoul (KR); Cheol Kyu Bok, Icheon-si (KR); Chang Moon Lim, Anyang-si (KR); Seung Chan Moon, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/420,698

(22) Filed: Apr. 8, 2009

(65) Prior Publication Data

US 2009/0191709 A1   Jul. 30, 2009

Related U.S. Application Data

(62) Division of application No. 11/304,052, filed on Dec. 15, 2005, now Pat. No. 7,534,548.

(30) Foreign Application Priority Data

Jun. 2, 2005   (KR)   ................ 10-2005-0047323
Jun. 2, 2005   (KR)   ................ 10-2005-0047324

(51) Int. Cl.
    *G03F 7/30*   (2006.01)

(52) U.S. Cl. .............. 430/313; 430/270.1; 430/314; 430/317; 430/905; 430/907; 430/910

(58) Field of Classification Search ........... 430/313, 430/314, 317, 270.1, 905, 907, 910
See application file for complete search history.

(56) References Cited

U.S. PATENT DOCUMENTS

| | | | |
|---|---|---|---|
| 5,272,042 A | 12/1993 | Allen et al. | |
| 6,017,677 A | 1/2000 | Maemoto et al. | |
| 6,017,683 A | 1/2000 | Endo et al. | |
| 6,225,020 B1 | 5/2001 | Jung et al. | |
| 6,316,162 B1 | 11/2001 | Jung et al. | ............ 430/291 |
| 6,576,392 B1 | 6/2003 | Sato et al. | |
| 6,653,047 B2 | 11/2003 | Lee et al. | |
| 6,777,162 B2 | 8/2004 | Choi | |
| 6,811,961 B2 | 11/2004 | Cameron et al. | |
| 6,855,476 B2 | 2/2005 | Ferreira et al. | |
| 6,864,192 B1 | 3/2005 | Liou et al. | |
| 6,933,094 B2 | 8/2005 | Miyaji et al. | |
| 6,946,235 B2 | 9/2005 | Harada et al. | |
| 7,125,642 B2 | 10/2006 | Harada et al. | |
| 7,303,858 B2 * | 12/2007 | Jung et al. | ............ 430/311 |
| 7,381,519 B2 | 6/2008 | Jung et al. | |
| 7,534,548 B2 * | 5/2009 | Jung et al. | ............ 430/270.1 |
| 2002/0042016 A1 | 4/2002 | Yoon et al. | |
| 2003/0013037 A1 | 1/2003 | Lee et al. | |
| 2003/0091928 A1 | 5/2003 | Choi | |
| 2003/0108815 A1 | 6/2003 | Jung et al. | |
| 2004/0024803 A1 | 2/2004 | Montijo | |
| 2005/0019690 A1 | 1/2005 | Kodama | |
| 2005/0038261 A1 | 2/2005 | Maesawa et al. | |
| 2007/0203312 A1 | 8/2007 | Lee et al. | |

FOREIGN PATENT DOCUMENTS

| | | |
|---|---|---|
| EP | 0628876 | 12/1994 |
| EP | 0938029 | 8/1999 |
| EP | 0985974 | 3/2000 |
| EP | 1120689 | 8/2001 |
| EP | 1122605 | 8/2001 |
| EP | 1164432 | 12/2001 |
| EP | 1179750 | 2/2002 |
| EP | 1253470 | 10/2002 |
| JP | 9-227634 | 9/1997 |
| JP | 2001117234 | 4/2001 |
| JP | 2002-169293 | 6/2002 |
| KR | 1020020009665 | 2/2002 |
| KR | 1517179 | 3/2005 |
| WO | WO-03077029 | 9/2003 |

OTHER PUBLICATIONS

First Office Action for Chinese Application No. 200510136300.3, dated April 10, 2009.
German-language Search Report dated Jun. 2, 2006, issued by the German Patent Office, during prosecution of the German counterpart to the Korean priority application(s).
Holland Search Report for Application No. NL 135697, dated Nov. 9, 2007.
Translation of Office Action for corresponding Taiwan Application No. 094146712, dated Jun. 12, 2008.

* cited by examiner

*Primary Examiner*—John S Chu
(74) *Attorney, Agent, or Firm*—Marshall, Gerstein & Borun LLP

(57) ABSTRACT

A polymer for immersion lithography comprising a repeating unit represented by Formula 1 and a photoresist composition containing the same. A photoresist film formed by the photoresist composition of the invention is highly resistant to dissolution, a photoacid generator in an aqueous solution for immersion lithography, thereby preventing contamination of an exposure lens and deformation of the photoresist pattern by exposure.

18 Claims, 6 Drawing Sheets

METHOD FOR MANUFACTURING A SEMICONDUCTOR DEVICE

CROSS-REFERENCE TO RELATED APPLICATIONS

This is a division of co-pending, commonly-assigned U.S. application Ser. No. 11/304,052 filed Dec. 15, 2005, which claims the convention priority of Korean applications 10-2005-0047323 filed Jun. 2, 2005, and 10-2005-0047324 filed Jun. 2, 2005, the entire respective disclosures of which are incorporated by reference herein.

BACKGROUND OF THE DISCLOSURE

1. Field of the Disclosure

This disclosure relates to a polymer for immersion lithography and a photoresist composition containing the same for obtaining a fine pattern in the manufacture of semiconductor devices.

2. Description of Related Technology

A currently used lithography process is a dry lithography process which employs an exposure system where a space between an exposure lens and a wafer is filled with air. In order to develop a device to 60 nm resolution using dry lithography, a new exposure system using light sources such as a $F_2$ laser (157 nm) or extreme ultraviolet (EUV) laser is required. However, it is difficult to develop a pellicle when the $F_2$ laser is used, and to develop a mask and light sources when the EUV laser is used.

Immersion lithography has been developed in order to overcome the above-described problems.

In immersion lithography, a suitable aqueous solution fills a space between a projection lens and a wafer, thereby increasing numerical aperture of optics corresponding to the refractive index of the solution. The actual wavelength of the light source in the solution is equivalent to a value calculated by dividing a wavelength of the light source in the air by the refractive index of the solution. For example, if water of which the reflective index is 1.44 is used as a medium, 193 nm wavelength of ArF light source is converted into 134 nm. This is the same effect when a light source having a shorter wavelength such as a $F_2$ laser (157 nm) is used to increase resolution.

However, since a space between projection lens and wafer is filled not with air but with an aqueous solution in conventional immersion lithography, a photoacid generator present in the photoresist may be dissolved in the aqueous solution, resulting in the contamination of an exposure lens and the deformation of the photoresist pattern.

SUMMARY OF THE DISCLOSURE

The disclosed provides a polymer for immersion lithography that prevents a photoacid generator from being dissolved in an aqueous solution for immersion lithography during an immersion lithography process. Also disclosed herein is a photoresist composition containing the same.

Additionally, disclosed herein is a method for forming a photoresist pattern using the disclosed photoresist composition, and a semiconductor device manufactured by the disclosed method.

BRIEF DESCRIPTION OF THE DRAWINGS

For a more complete understanding of the invention, reference should be made to the following detailed description and accompanying drawings wherein.

Figure 1A:
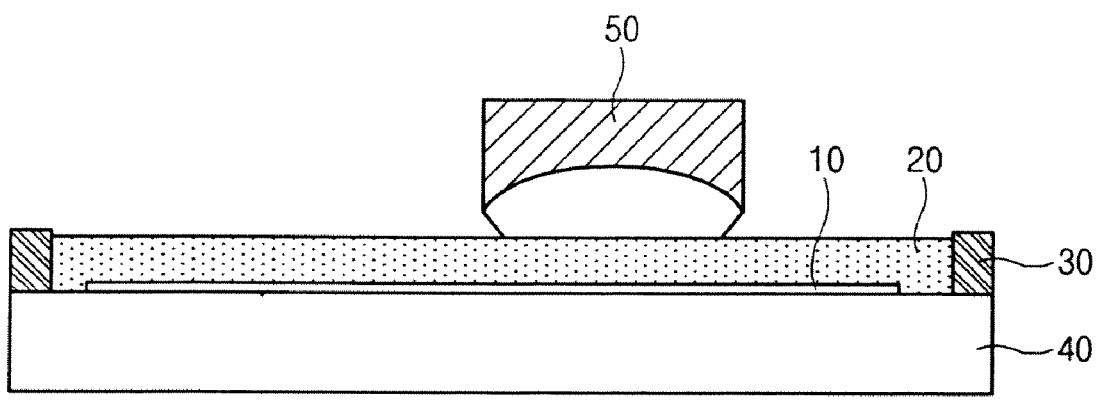
FIG. 1a is a cross-sectional diagram illustrating a bath-type immersion lithography exposer used in this disclosure.

The specification, drawings and examples are intended to be illustrative, and are not intended to limit this disclosure to the specific embodiments described herein.

DETAILED DESCRIPTION OF PREFERRED EMBODIMENTS

There is a provided a photoacid generating polymer for immersion lithography obtained by directly combining a photoacid generator with a photoresist polymer. The polymer comprises a repeating unit represented by Formula 1:

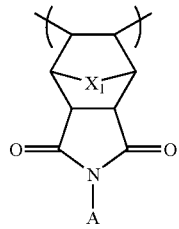

[Formula 1]

wherein $X_1$ is $C_1$-$C_{10}$ alkylene, sulfur or oxygen; and

A is a photoacid generating group, and any suitable photoacid generators may be used without limitation. In this context, "photoacid generating group" means a group generating an acid by light exposure. Preferably, $X_1$ is $C_1$-$C_3$ alkylene and the repeating unit including A is represented by Formula 1a:

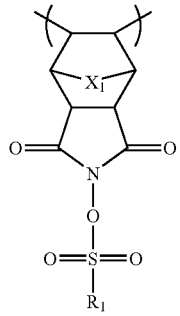

[Formula 1a]

wherein $X_1$ is $C_1$-$C_{10}$ alkylene, sulfur or oxygen; and
$R_1$ is linear or branched $C_1$-$C_{10}$ alkyl, or linear or branched $C_1$-$C_{10}$ alkyl partially or wholly substituted with halogen.

Preferably, the repeating unit represented by Formula 1a is represented by Formula 1b:

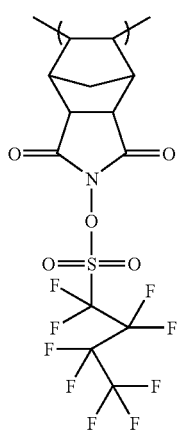

[Formula 1b]

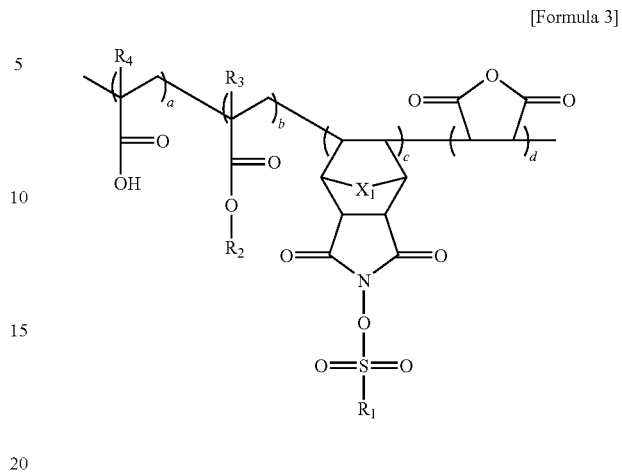

[Formula 3]

In the polymer of Formula 1a, a component that serves as a photoacid generator is sulfonate group ($-SO_3^-$), where sulfonic acid ($-SO_3H$) is generated by light exposure.

In this way, by directly combining a group serving as an aqueous photoacid generator to the compound of an organic photoresist-type polymer, the photoacid generator can be prevented from being dissolved in the aqueous solution for immersion lithography during the light exposure.

Preferably, the polymer includes a polymerization repeating unit represented by Formula 2 or 3:

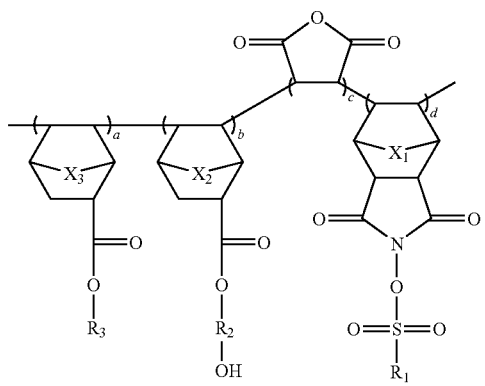

[Formula 2]

wherein $X_1$, $X_2$ and $X_3$ are individually $C_1$-$C_{10}$ alkylene, sulfur or oxygen;

$R_1$ is linear or branched $C_1$-$C_{10}$ alkyl, or linear or branched $C_1$-$C_{10}$ alkyl partially or wholly substituted with halogen;

$R_2$ is linear or branched $C_1$-$C_{10}$ alkylene, or linear or branched $C_1$-$C_{10}$ alkylene partially substituted with halogen;

$R_3$ is an acid labile protecting group; and the relative amount of a:b:c:d is 100:10~40:30~70:10~40 on the basis of parts by weight.

wherein $X_1$ is $C_1$-$C_{10}$ alkylene, sulfur or oxygen;

$R_1$ is linear or branched $C_1$-$C_{10}$ alkyl, or linear or branched $C_1$-$C_{10}$ alkyl partially or wholly substituted with halogen;

$R_2$ is an acid labile protecting group;

$R_3$ and $R_4$ are individually hydrogen or methyl; and the relative amount of a:b:c:d is 5~30:100:5~30:5~70 on the basis of parts by weight.

The "acid labile protecting group" is a group which can be detached by acid. When the acid labile protecting group is combined to the photoresist, it prevents the photoresist from dissolving in an alkaline developing solution. However, when the acid labile protecting group is detached by acid generated by light exposure, the photoresist may be dissolved in the alkaline developing solution.

Any suitable acid labile protecting groups can be used. Suitable examples are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001), the respective disclosures of which are incorporated herein by reference.

Preferably, the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methyoxyproyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl, and 2-acetylment-1-yl.

Preferably, the polymerization repeating unit of Formula 2 or 3 is represented by Formula 2a or 3a, respectively:

[Formula 2a]

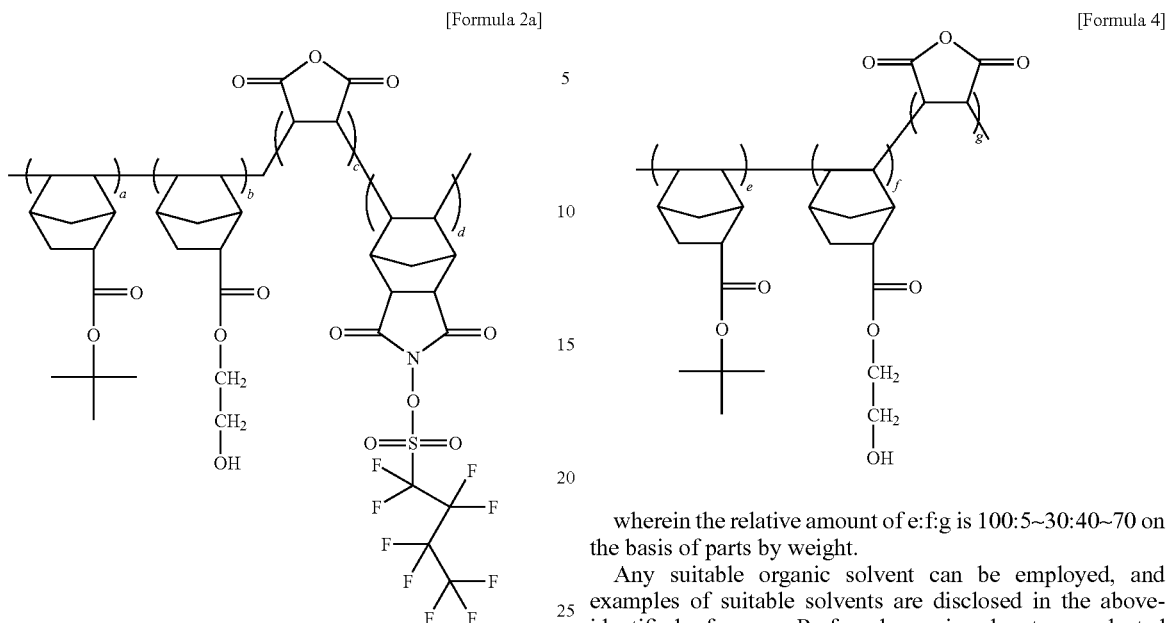

wherein the relative amount of a:b:c:d is 100:10~40:30~70: 10~40 on the basis of parts by weight.

[Formula 3a]

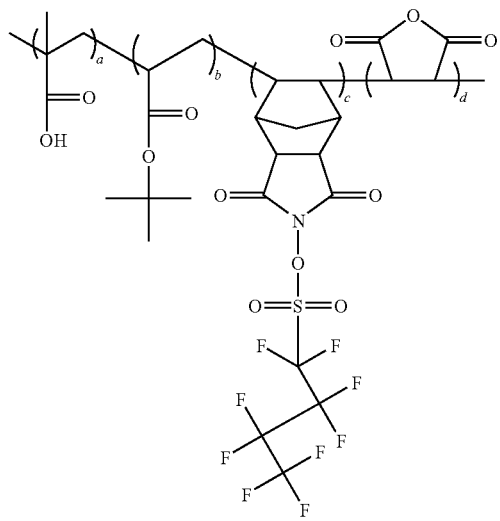

wherein the relative amount of a:b:c:d is 5~30:100:5~30: 5~70 on the basis of parts by weight.

The disclosed polymer includes the polymerization repeating unit in the linear chain. If necessary, the disclosed polymer may further include another monomers or additives.

Also, there is provided a photoresist composition containing the disclosed polymer and an organic solvent. If necessary, the disclosed photoresist composition may further contain a photoacid generator, a photoresist polymer, and/or an additive. Preferably, the disclosed photoresist composition is used for immersion lithography.

The photoresist polymer can be a chemically amplified photoresist polymer. Preferably, the photoresist polymer is a polymer including a polymerization repeating unit represented by Formula 4:

[Formula 4]

wherein the relative amount of e:f:g is 100:5~30:40~70 on the basis of parts by weight.

Any suitable organic solvent can be employed, and examples of suitable solvents are disclosed in the above-identified references. Preferred organic solvents are selected from the group consisting of methyl 3-methoxy propionate, ethyl 3-ethoxy propionate, propylene glycol methyl ether acetate, cyclohexanone, 2-heptanone, ethyl lactate and mixtures thereof. Preferably, the organic solvent is present in an amount ranging from 500 to 3,000 parts by weight based on the photoresist polymer for immersion lithography.

When a photoresist polymer is further comprised, the polymer of the invention is preferably present in an amount ranging from 5 to 20 parts by weight based on 100 parts of the photoresist composition.

The use of the disclosed polymer is not limited for immersion lithography, and it can be used in a general dry lithography process. In the prior art, a photoacid generator is included as separate molecules in the photoresist composition and non-uniformly distributed in the photoresist composition when the photoresist composition is coated to form a photoresist film. As a result, even unexposed photoresist film may be developed by use of low levels of exposure energy. However, since the photoacid generator is directly combined with the organic polymer in the inventive polymer, the photoacid generator is uniformly distributed, thereby preventing the unexposed portion from being developed under low levels of exposure energy.

In addition, there is provided a method for manufacturing a semiconductor device, including the steps of:

(a) coating the photoresist composition described above on an underlying layer to form a photoresist film;

(b) exposing the photoresist film;

(c) developing the exposed photoresist film to obtain a photoresist pattern; and (d) performing an etching process using the photoresist pattern as an etching mask to etch the underlying layer, thereby obtaining an underlying layer pattern.

Preferably, the exposing step (b) is performed using exposure equipment for immersion lithography. The above method may further comprise a soft-baking step before the exposing step (b) or a post-baking step after the exposing step (b). Preferably, the baking steps are performed at a temperature ranging from 70° C. to 200° C.

The light source of the step (b) is preferably selected from the group consisting of $F_2$ (157 nm), ArF (193 nm), KrF (248 nm), E-beam, EUV (extreme ultraviolet) and ion-beam, and the exposing step (b) is preferably performed with an exposure energy ranging from about 1 mJ/cm$^2$ to about 100 mJ/cm$^2$.

Step (c) can be performed in an alkaline developing solution, which is preferably TMAH (tetramethylammonium hydroxide) aqueous solution ranging from 0.5 to 5 wt %.

The exposer for immersion lithography typically includes an immersion lens unit, a wafer stage, and a projection lens unit. The immersion lens unit is configured to include a housing unit, a supply unit, and a recovery unit of an aqueous solution for immersion lithography. The aqueous solution for immersion lithography is applied to the immersion lens unit during the exposing step.

The exposer for immersion lithography is preferably any of a shower-type, a bath-type or a submarine-type exposer.

FIG. 1a shows a bath-type exposer for immersion lithography including an immersion lens unit 30 so as to cover the entire surface of a wafer 10 with an aqueous solution 20 for immersion lithography.

Figure 1B:
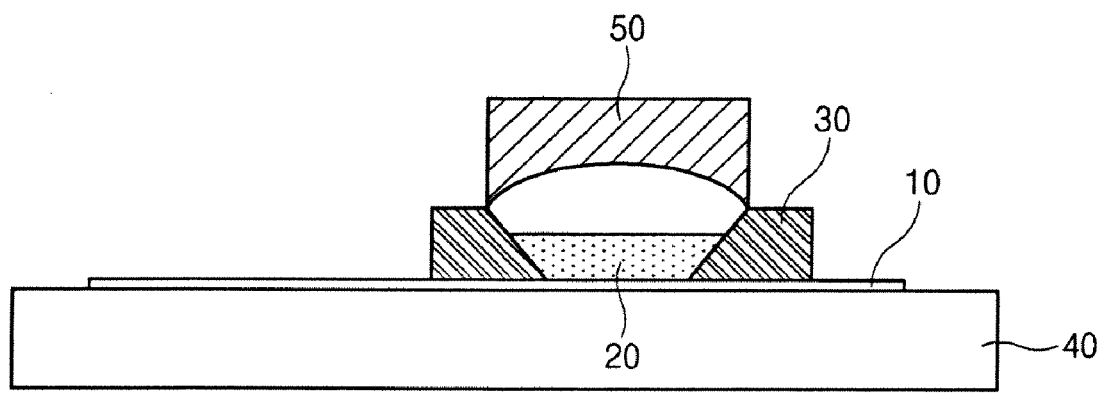
FIG. 1b is a cross-sectional diagram illustrating a shower-type immersion lithography exposer used in this disclosure.

FIG. 1b shows a shower-type exposer for immersion lithography including an immersion lens unit 30 which houses the aqueous solution 20 for immersion lithography at the bottom of a projection lens unit 50.

Figure 1C:
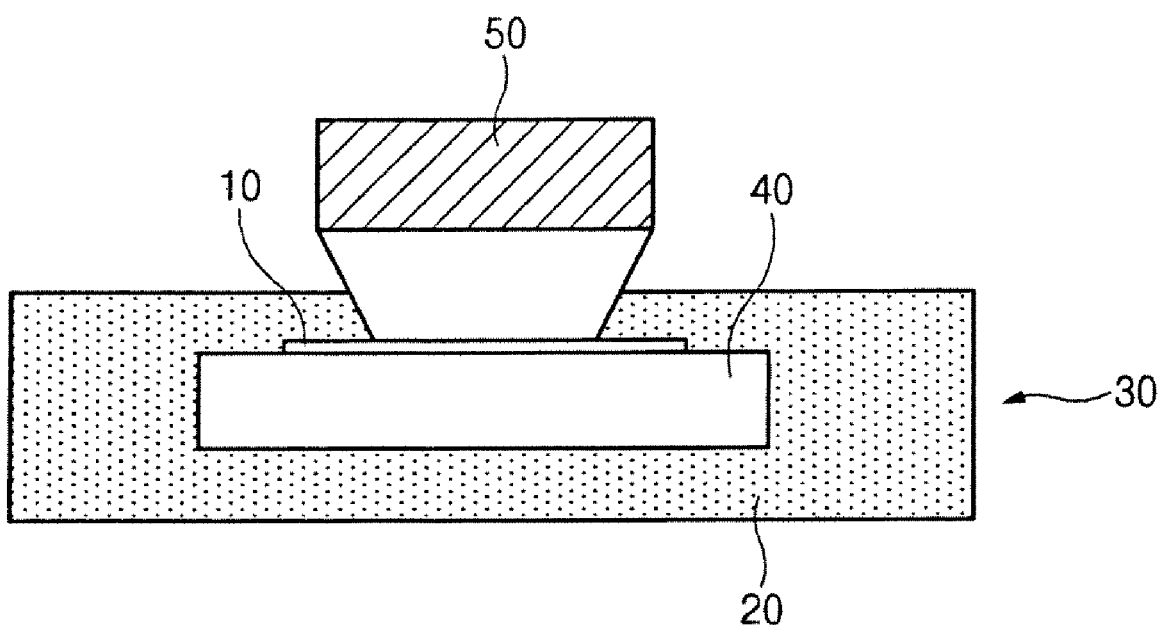
FIG. 1c is a cross-sectional diagram illustrating a submarine-type immersion lithography exposer used in this disclosure.

FIG. 1c shows a submarine-type exposer for immersion lithography including an immersion lens unit 30 where a wafer stage 40 on which a wafer 10 is mounted is submerged in the aqueous solution 20 for immersion lithography.

Also, a semiconductor device manufactured by the disclosed method is provided.

EXAMPLES

The invention will be described in detail by referring to examples below, which are not intended to limit the present invention.

Preparation Example 1

Synthesis of poly(t-butyl bicyclo[2,2,1]hept-5-en-2-carboxylate/2-hydroxyethyl bicyclo[2,2,1]hept-5-en-2-carboxylate/N-[(perfluorobutan sulfonyl)oxy]-norbonane-2,3-dicarboxyimide/maleic Anhydride)

Figure 2A:
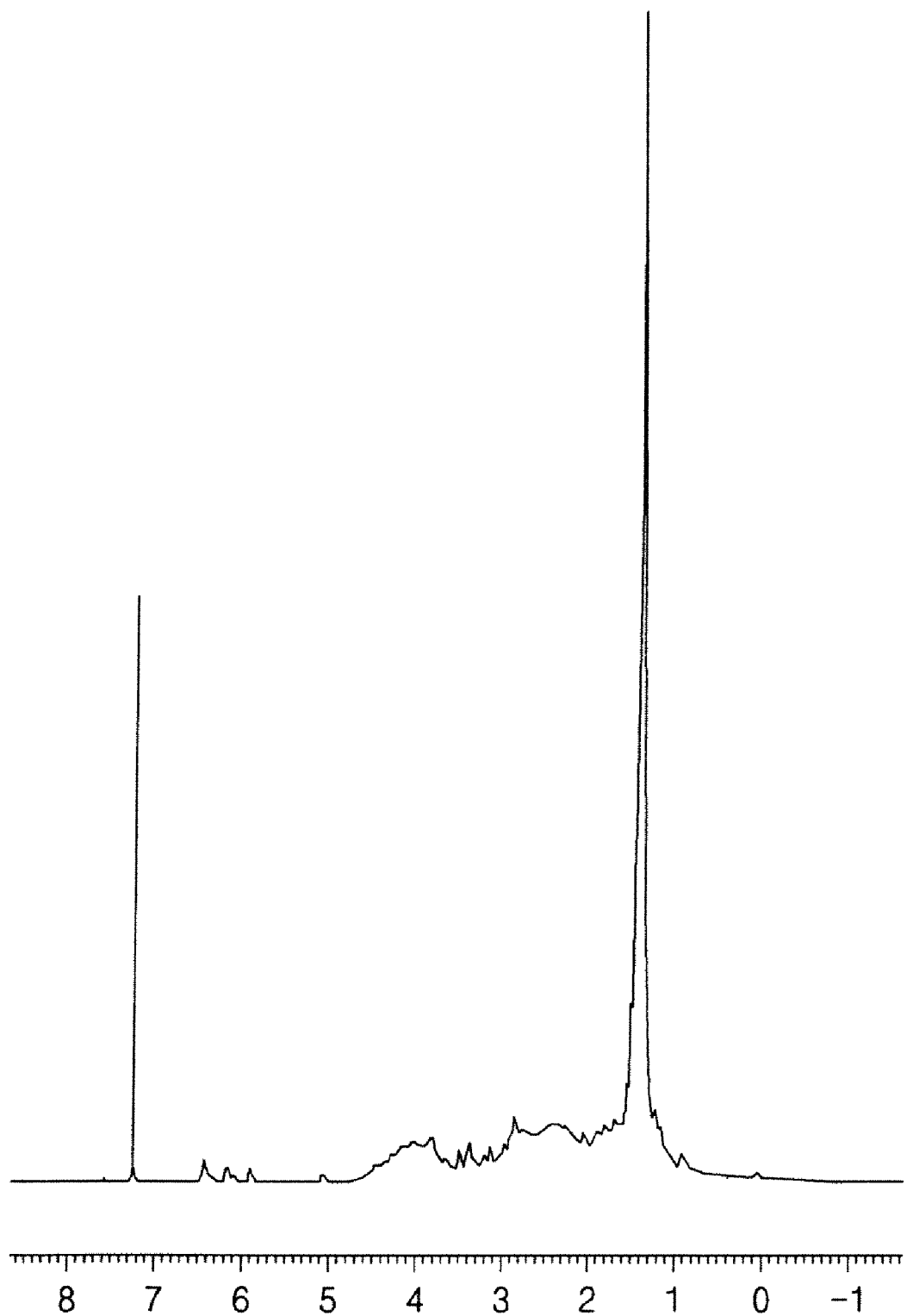
FIG. 2a is an NMR spectrum illustrating a polymer obtained from Preparation Example 1.

Into THF (tetrahydrofuran) (40 g) were dissolved t-butyl bicyclo[2,2,1]hept-5-en-2-carboxylate (19.41 g), 2-hydroxyethyl bicyclo[2,2,1]hept-5-en-2-carboxylate (5.4 g), N-[(perfluorobutan sulfonyl)oxy-norbonane-2,3-dicarboxylmide (9.5 g), maleic anhydride (14 g) and AIBN (2,2'-azobisisobutyronitrile) (1.35 g) as a polymerization initiator. The resulting mixture was polymerized at 67° C. for 24 hours. After reaction, precipitates were obtained in ethyl ether, filtered, and dehydrated in a vacuum, thereby synthesizing a compound of Formula 2a for immersion lithography (see the NMR spectrum of FIG. 2a).

Preparation Example 2

Synthesis of poly(methyl methacrylic acid/t-butyl acrylate/maleic anhydride/N-[(perfluoroctansulfonyl) oxy]-norbonane-2,3-dicarboxyimide)

Figure 2B:
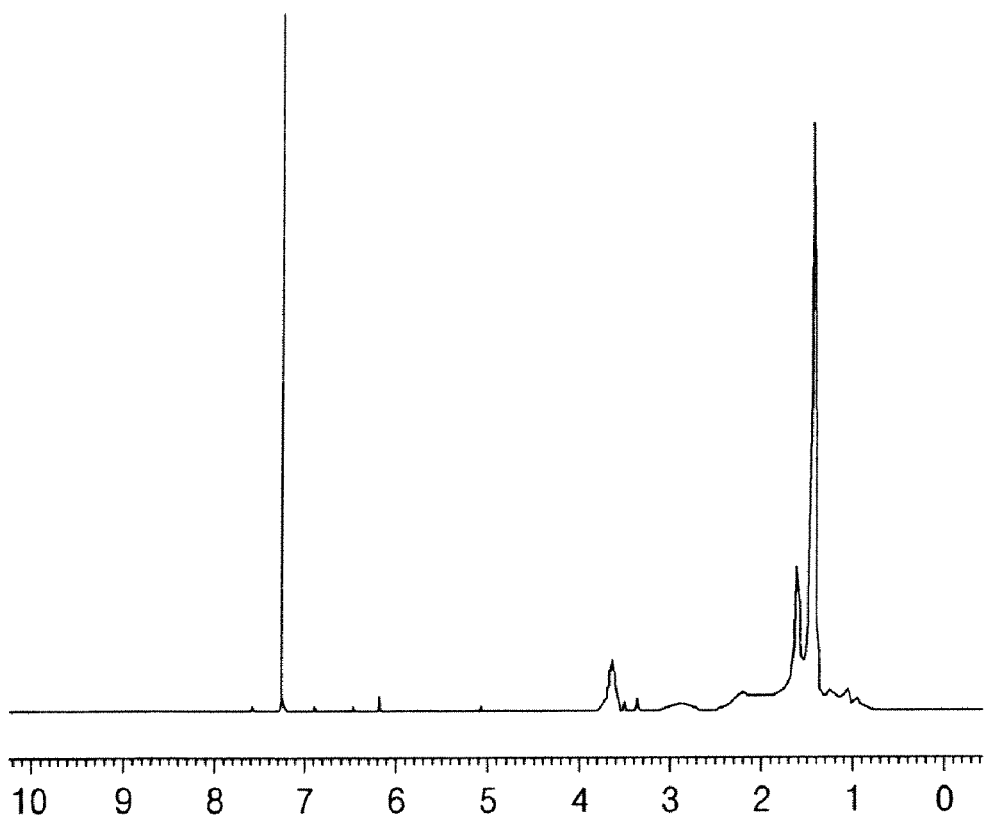
FIG. 2b is an NMR spectrum illustrating a polymer obtained from Preparation Example 2.

Into acetone (45 g) were dissolved methyl methacrylic acid (2.0 g), t-butyl acrylate (9.0 g), maleic anhydride (2.0 g), N-[(perfluoroctansulfonyl)oxy]-norbonane-2,3-dicarboxylmide (2.0 g) and AIBN (2,2'-azobisisobutyronitrile) (0.3 g) as a polymerization initiator. The resulting mixture was polymerized at 67° C. for six hours. After polymerization, precipitates were obtained in water, filtered, and dehydrated in a vacuum, thereby obtaining the compound of Formula 3a (yield: 48%, see the NMR spectrum of FIG. 2b).

Preparation Example 3

Synthesis of poly(t-butyl bicyclo[2,2,1]hept-5-en-2-carboxylate/2-hydroxyethyl bicyclo[2,2,1]hept-5-en-2-carboxylate/maleic anhydride)

Into THF (20 g) were dissolved t-butyl bicyclo[2,2,1]hept-5-en-2-carboxylate (23.57 g), 2-hydroxyethyl bicyclo[2,2,1]hept-5-en-2-carboxylate (3.90 g), maleic anhydride (14 g) and AIBN (2,2'-azobisisobutyronitrile) (0.55 g) as a polymerization initiator. The resulting mixture was polymerized at 67° C. for 24 hours. After polymerization, precipitates were obtained in ethyl ether, filtered, and dehydrated in a vacuum, thereby obtaining the compound of Formula 4 (yield: 76%).

Example 1

Preparation of a Disclosed Photoresist Composition for Immersion Lithography (1)

Into propylene glycol methyl ether acetate (13 g) were dissolved the polymer of Formula 2a (1 g) obtained from Preparation Example 1 and triethanol amine (0.006 g), thereby obtaining a disclosed photoresist composition for immersion lithography.

Example 2

Preparation of a Disclosed Photoresist Composition for Immersion Lithography (2)

Into propylene glycol methyletheracetate (13 g) were dissolved the polymer (0.1 g) obtained from Preparation Example 2 as a photoacid generator, the polymer (1 g) obtained from Preparation Example 3 as a photoresist polymer and triethanol amine (0.001 g), thereby obtaining a disclosed photoresist composition for immersion lithography.

Example 3

Formation of a Disclosed Photoresist Pattern (1)

The photoresist composition for immersion lithography obtained from Example 1 was coated at a thickness of 240 nm on a wafer, and soft-baked at 130° C. for 90 seconds, thereby obtaining a photoresist film. Then, the coated wafer was precipitated in water for three minutes so as to investigate whether a photoresist pattern formed by the disclosed photoresist composition for immersion lithography would be affected by the aqueous solution for immersion lithography.

Next, the photoresist film was exposed using an ArF exposer, and post-baked at 130° C. for 90 seconds. Then, it was developed in 2.38 wt % TMAH aqueous solution for 40 seconds, thereby obtaining a photoresist pattern (see FIG. 3a).

Figure 3A:
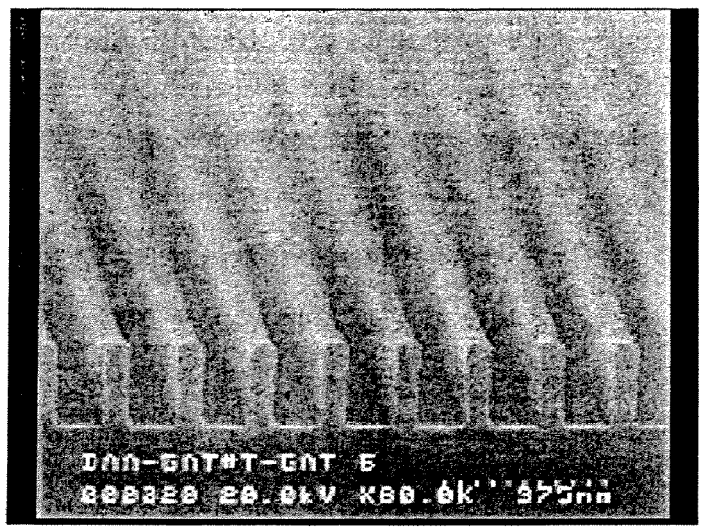
FIG. 3a is a photograph illustrating a photoresist pattern obtained from Example 3.

As shown in FIG. 3a, the photoresist pattern was vertically formed by the disclosed photoresist composition for immersion lithography.

Example 4

Formation of a Disclosed Photoresist Pattern (2)

The procedure of Example 3 was repeated except in that the photoresist composition for immersion lithography obtained from Example 2 was coated at a thickness of 200 nm on a wafer, thereby obtaining a photoresist pattern.

Figure 3B:
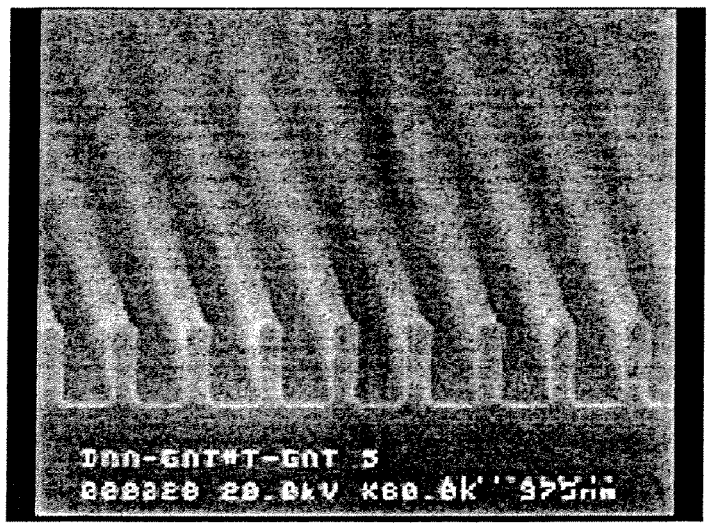
FIG. 3b is a photograph illustrating a photoresist pattern obtained from Example 4.

As shown in FIG. 3b, the photoresist pattern was vertically formed by the disclosed photoresist composition for immersion lithography.

Comparative Example

Formation of a Photoresist Pattern

A photosentisizer (produced by JSR Co.; AR1221J) including a separate photoacid generator was coated at a thickness of 240 nm on a wafer, and soft-baked at 130° C. for 90 seconds, thereby obtaining a photoresist film. Then, the coated wafer was precipitated in water for three minutes so as to investigate whether the photoresist pattern formed by the conventional photoresist composition would be affected by the aqueous solution for immersion lithography.

Next, the photoresist film was exposed using an ArF exposer, and post-baked at 130° C. for 90 seconds. Then, it was developed in 2.38 wt % TMAH aqueous solution for 40 seconds, thereby obtaining a photoresist pattern (see FIG. 4).

Figure 4:
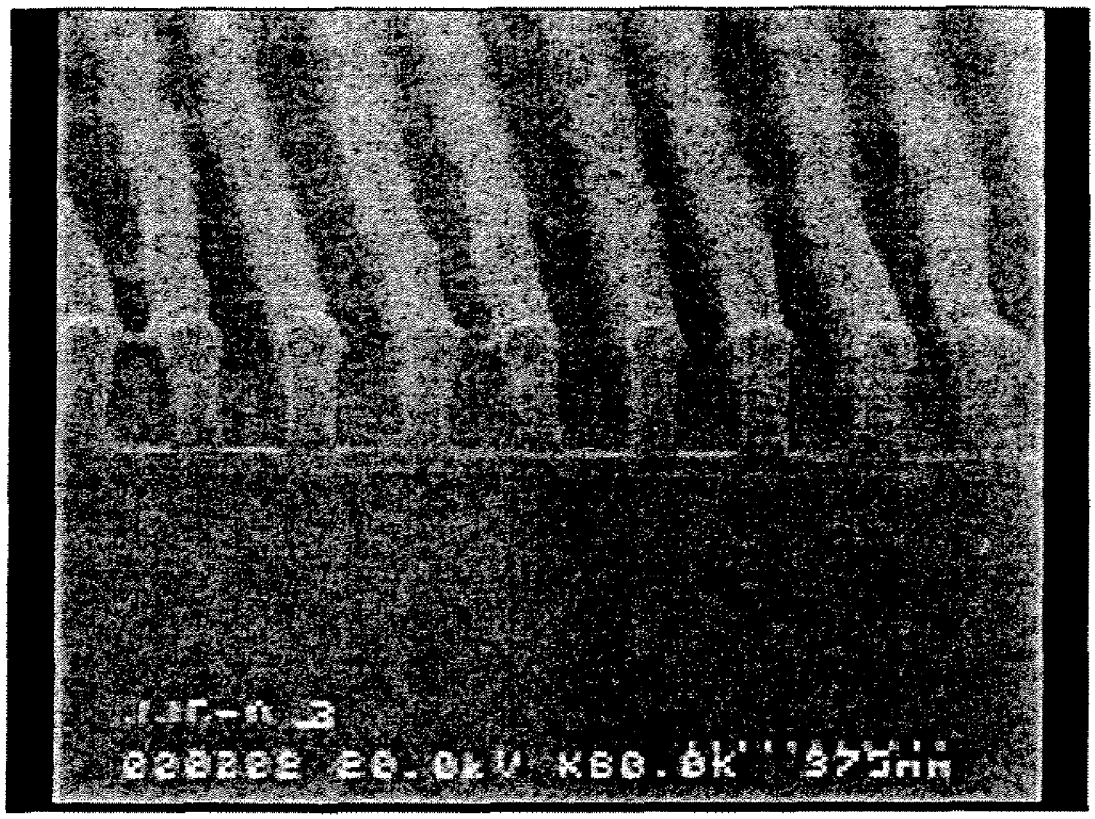
FIG. 4 is a photograph illustrating a photoresist pattern obtained from Comparative Example.

As shown in FIG. 4, the photoresist pattern was not vertically formed, but deformed by the conventional photoresist composition.

As described above, a photoresist pattern is vertically formed with a disclosed composition. Photoacid generator is not dissolved into an aqueous solution for immersion lithography even when a photoresist film formed by the composition contacts with the aqueous solution for a long time, thereby preventing contamination of an exposure lens and deformation of the photoresist pattern by exposure.

The invention claimed is:

1. A method for manufacturing a semiconductor device, comprising the steps of:
   (a) coating a photoresist composition on an underlying layer to form a photoresist film, the photoresist composition comprising a photoacid generating polymer and an organic solvent, the photoacid generating polymer comprising a repeating unit represented by Formula 1:

[Formula 1]

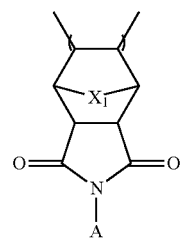

wherein $X_1$ is a $C_1$-$C_{10}$ alkylene group and A is a photoacid generating group;
   (b) exposing the photoresist film;
   (c) developing the exposed photoresist film to obtain a photoresist pattern; and
   (d) performing an etching process using the photoresist pattern as an etching mask to etch the underlying layer, thereby obtaining an underlying layer pattern.

2. The method of claim 1, comprising performing the exposing step (b) using exposure equipment for immersion lithography.

3. The method of claim 1, further comprising a soft-baking process before the exposing step (b) or a post-baking process after the exposing step (b).

4. The method of claim 3, comprising performing the baking step at a temperature ranging from 70° C. to 200° C.

5. The method of claim 1, wherein the light source of the step (b) is selected from the group consisting of $F_2$ (157 nm), ArF (193 nm), KrF (248 nm), E-beam, EUV (extreme ultraviolet) and ion-beam.

6. The method of claim 1, comprising performing the exposing step (b) with an exposure energy ranging from about 1 mJ/cm² to about 100 mJ/cm².

7. The method of claim 1, comprising performing the developing step (c) with an alkali developing solution.

8. The method of claim 1, wherein the repeating unit is represented by Formula 1b:

[Formula 1b]

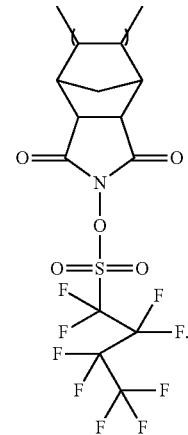

9. The method of claim 1, wherein the photoacid generating polymer comprises a polymerization repeating unit represented by Formula 2:

[Formula 2]

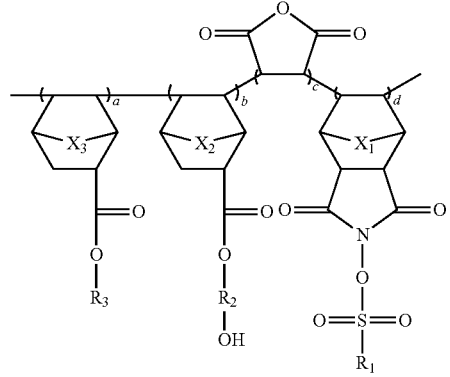

wherein $X_1$ and $X_2$ are individually a $C_1$-$C_{10}$ alkylene group, sulfur, or oxygen, $X_3$ is a $C_1$-$C_{10}$ alkylene group;
$R_1$ is a linear or branched $C_1$-$C_{10}$ alkyl group, or a linear or branched $C_1$-$C_{10}$ alkyl group partially or wholly substituted with halogen;

$R_2$ is a linear or branched $C_1$-$C_{10}$ alkylene group, or linear or branched $C_1$-$C_{10}$ alkylene group partially substituted with halogen; and $R_3$ is an acid labile protecting group; wherein the relative amount of a:b:c:d is 100:10~40:30~70:10~40 on the basis of parts by weight.

10. The method of claim 9, wherein the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methyoxyproyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl, and 2-acetylment-1-yl.

11. The method of claim 9, wherein the polymerization repeating unit is represented by Formula 2a:

[Formula 2a]

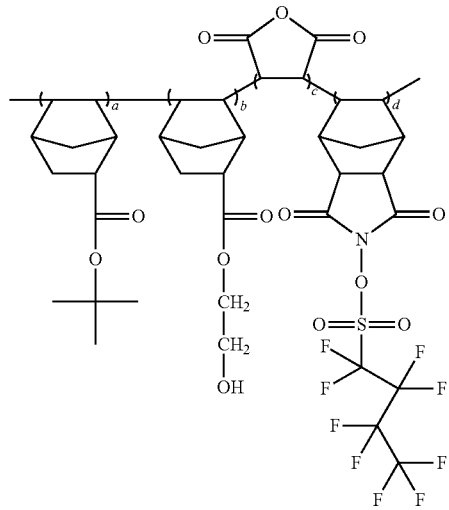

wherein the relative amount of a:b:c:d is 100:10~40:30~70:10~40 on the basis of parts by weight.

12. The method of claim 1, wherein the photoacid generating polymer comprises a polymerization repeating unit represented by Formula 3:

[Formula 3]

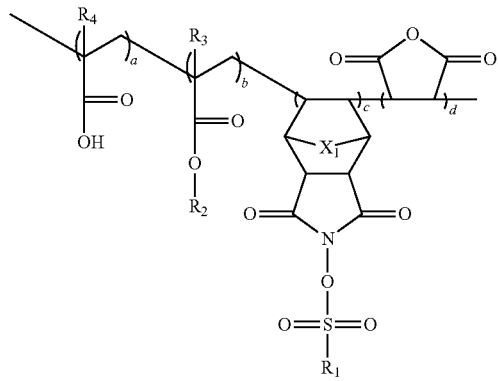

wherein $X_1$ is a $C_1$-$C_{10}$ alkylene group;
$R_1$ is a linear or branched $C_1$-$C_{10}$ alkyl group, or a linear or branched $C_1$-$C_{10}$ alkyl group partially or wholly substituted with halogen; $R_2$ is an acid labile protecting group; and
$R_3$ and $R_4$ are individually hydrogen or a methyl group;
wherein the relative amount of a:b:c:d is 5~30:100:5~30: 5~70 on the basis of parts by weight.

13. The method of claim 12, wherein the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methyoxyproyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl, and 2-acetylment-1-yl.

14. The method of claim 12, wherein the polymerization repeating unit is represented by Formula 3a:

[Formula 3a]

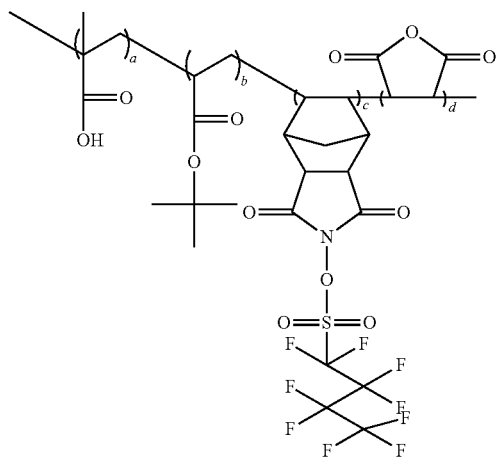

wherein the relative amount of a:b:c:d is 5~30:100:5~30: 5~70 in the basis of parts by weight.

15. The method of claim 1, wherein the organic solvent is selected from the group consisting of methyl 3-methoxy propionate, ethyl 3-ethoxy propionate, propylene glycol methyl ethe racetate, cyclohexanone, 2-heptanone, ethyl lacetate, and mixtures thereof.

16. The method of claim 1, the composition further comprising at least one component selected from the group consisting of photoacid generators, photoresist polymers and additives.

17. The method of claim 16, wherein the component is a photoresist polymer is represented by Formula 4:

[Formula 4]

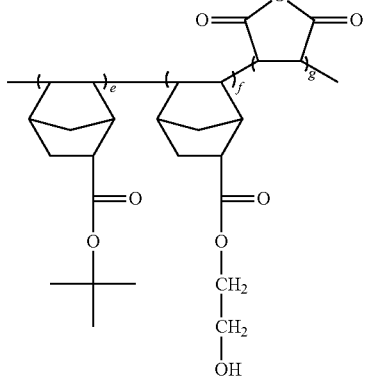

wherein the relative amount of e:f:g is 100:5~30:40~70 on the basis of parts by weight.

18. The method of claim 16, wherein the component is a photoresist polymer present in an amount ranging from 5 to 20 parts by weight based on 100 parts by weight of the photoresist composition.

* * * * *